(12) United States Patent
LeColst (10) Patent No.: US 6,476,628 B1
(45) Date of Patent: Nov. 5, 2002

(54) SEMICONDUCTOR PARALLEL TESTER

(75) Inventor: Arthur E. LeColst, Moorpark, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/340,832

(22) Filed: Jun. 28, 1999

(51) Int. Cl.[7] .................. G01R 31/26; G01R 31/02; H01H 31/02
(52) U.S. Cl. ................. 324/765; 324/754; 324/761; 324/537
(58) Field of Search .............. 324/754, 761, 324/765, 537

(56) References Cited

U.S. PATENT DOCUMENTS

| | | | | |
|---|---|---|---|---|
| 4,760,924 A | * | 8/1988 | Sato et al. ................. 209/573 |
| 5,517,126 A | * | 5/1996 | Yamaguchi ................. 324/758 |
| 5,546,405 A | * | 8/1996 | Golla .......................... 714/724 |
| 5,729,150 A | * | 3/1998 | Schwindt .................... 324/762 |
| 5,907,245 A | * | 5/1999 | Fredrickson ................ 324/754 |
| 5,907,247 A | * | 5/1999 | Vogley ........................ 324/765 |
| 6,028,439 A | * | 2/2000 | Arkin et al. ................ 324/765 |
| 6,166,553 A | * | 12/2000 | Sinsheimer ................. 324/754 |
| 6,204,679 B1 | * | 3/2001 | Gray .......................... 324/760 |

* cited by examiner

*Primary Examiner*—N. Le
*Assistant Examiner*—Wasseem M. Hamdan
(74) *Attorney, Agent, or Firm*—Lance Kreisman (57) ABSTRACT

A semiconductor parallel tester is disclosed for simultaneously testing a plurality of DUTs secured to a handling apparatus. The test system includes a system controller for initiating system test signals and a pin electronics assembly responsive to the system test signals to generate test pattern signals for application to the plurality of DUTs. The system further includes a signal interface defining a plurality of direct signal paths between the handling apparatus and the pin electronics assembly.

10 Claims, 7 Drawing Sheets

SEMICONDUCTOR PARALLEL TESTER

FIELD OF THE INVENTION

The invention relates generally to automatic test equipment for testing semiconductor devices, and more particularly a semiconductor tester capable of simultaneously testing a relatively large number of semiconductor devices in parallel.

BACKGROUND OF THE INVENTION

Semiconductor manufacturers employ a variety of different processes in the fabrication of semiconductor devices. One of the more critical processes involves electronically testing each and every chip according to predetermined criteria. This generally involves stimulating the inputs of the device to generate expected output signals, and monitoring the actual output signals to verify that the actual and expected outputs match. The test procedure is often conducted first at the wafer level to weed out devices early in the production process, and later at the packaged-device level.

To carry out the test process, semiconductor manufacturers typically utilize sophisticated machines commonly referred to as automatic test equipment (ATE) or testers. ATE designed for a production environment is often fairly costly, thereby contributing to the overall unit cost for each semiconductor device. Semiconductor manufacturers have thus realized that in order to minimize device unit costs, and remain competitive, the ATE must provide significant cost savings to warrant its high cost.

One way that ATE contributes to lower fabrication costs is by simultaneously testing groups of devices-under-test (DUTs) in parallel. This is commonly done for relatively low pin count memory devices and dramatically improves device throughput. This consequently reduces unit costs. Conventional parallel testers typically include a computer-driven test controller or mainframe unit that couples to a separately disposed testhead via a fairly large cable bundle. The bundle includes several hundred signal cables that collectively terminate in a first backplane assembly. The testhead generally includes a plurality of circuit boards that mount the pin electronics necessary to electronically interface with the pins of each DUT. Connections from the pin electronics are routed to a second backplane assembly, and carried through to individual double-sided pogo pins installed in a pogo or probe ring. The second backplane assembly is often constructed with relatively long trace patterns that tend to require sophisticated and expensive impedance control schemes in an effort to optimize signal quality.

One of the limitations in the number of DUTs that can be tested at any given time results from the construction of the probe ring. The dimensions of the probe ring is generally dependent on the size of a semiconductor wafer and the probe card that engages the wafer. Semiconductor wafers are often around 200 mm in diameter that dictates a 300–350 mm diameter probe card for signal routing purposes. The wafer, in turn, collectively comprises tens of DUTs having contact points accessible by finely tipped probes. Each signal path through the tester corresponding to a DUT contact point or "pin" must generally comprise a 50 ohm transmission line for optimal signal quality. This often involves surrounding each signal path through the probe ring with ground paths.

For example, conventional testers that test sixteen memory devices in parallel, each having around 32 pins, generally require approximately 512 signal pogo pins in the probe ring. Moreover, to ensure optimal signal quality, each signal pin is often surrounded by a plurality of ground pogo pins. However, as device pin counts and the need for higher parallelism increase, requiring more and more conventional signal and ground pogo pins positioned in the finite pogo ring, at some point the pogo density begins to degrade the 50 ohm characteristics of each signal path.

Semiconductor manufacturers that utilize complex ATE are also concerned with the expected uninterrupted operation time before the system has to "stand down." Typically expressed as "mean time before failure", or MTBF, this parameter plays an important role in determining unit costs. By maximizing the MTBF, more DUTs can be tested in a given period of time because of the overall increased eficiency of the testing operations.

One problem that contributes to a reduction in MTBF with conventional parallel testers involves the signal degradation caused by a faulty connection in a signal path. As noted above, conventional parallel testers that employ typical testheads utilize multiple backplane assemblies, contributing to a relatively high number of terminations and connections for individual signal paths. Generally, the more terminations and connections for a given path, the higher the probability of a failure therealong.

Another problem encountered with conventional parallel testers involves the difficulty in field troubleshooting and repairing specific signal paths. The time to repair a tester is often expressed as the "mean time to repair" (MTTR), and afects unit costs in much the same way as the MTBF. Typically, the signal path connections are often routed through various areas in the cable bundle, the respective backplane assemblies, and the pogo ring with little regard for quick troubleshooting and repair or replacement. This often results in a relatively long MTTR for a tester should a problem arise in one of the connections.

What is needed and heretofore unavailable is a parallel semiconductor tester capable of testing a large number of DUTs in parallel with minimal impact to the signal quality along each signal path. Moreover, the need exists for such a tester having a relatively high MTBF and relatively low MTTR to maximize device throughput for corresponding reductions in unit costs. The semiconductor tester of the present invention satisfies these needs.

SUMMARY OF THE INVENTION

The semiconductor parallel tester of the present invention provides the capability of simultaneously testing groups of DUTs without compromising on the signal integrity for each tester signal path. The tester also substantially improves the mean time between failures by minimizing the complexity of the signal interconnections. Further, the mean time to repair is dramatically minimized by modularizing many of the tester components.

To realize the foregoing advantages, the invention in one form comprises a semiconductor parallel tester for simultaneously testing a plurality of DUTs secured to a handling apparatus. The test system includes a system controller for initiating system test signals and a pin electronics assembly responsive to the system test signals to generate test pattern signals for application to the plurality of DUTs. The system further includes a signal interface defining a plurality of direct signal paths between the handling apparatus and the pin electronics assembly.

In another form, the invention comprises a signal interface for establishing a plurality of direct signal paths between a handling apparatus and a pin electronics assembly in a semiconductor tester. The signal interface includes a substantially circular probe ring formed with a plurality of axially opening cavities. The cavities are disposed in a spaced-apart annular configuration. The signal interface also includes a plurality of modular harness assemblies. Each of the modular harness assemblies includes respective proximal and distal ends. The proximal end includes a pogo module for nesting in one of the axially opening cavities and the distal end includes at least one connector for engaging the pin electronics assembly.

In yet another form, the invention comprises a pogo pin assembly for high-density integration in a semiconductor tester prober interface. The pogo pin assembly includes a coaxial cable having a center conductor and a shield. The shield terminates at a distal end with the center conductor projecting axially from the distal end and defining a distal tip. A pogo pin is fixed in close-spaced axial relationship to the distal tip via a pogo receptacle. An impedance compensation element couples to the cable and pogo pin.

In a further form, the invention comprises a modular pin electronics assembly for use in a semiconductor tester. The pin electronics assembly includes a board frame comprising a pair of frame members. Each of the frame members are formed with at least one U-shaped border configured to receive a circuit board. A hinge assembly is disposed between the pair of frame members sufficient to allow the frame members to fold in a substantially 180 degree relationship.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
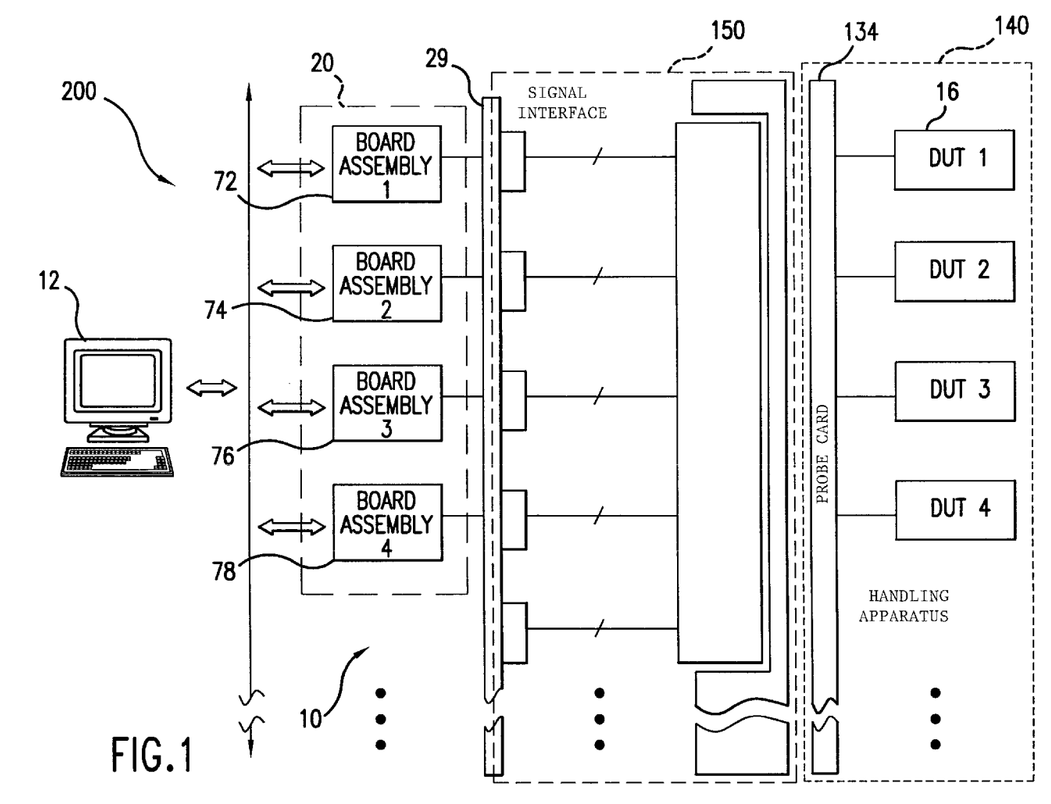
FIG. 1 is a partial block diagram representation of a semiconductor parallel tester according to one embodiment of the present invention.

Referring now to FIG. 1, a semiconductor tester according to one embodiment of the present invention, and generally designated 10, includes a system controller 12 and pin electronics 20 responsive to the system controller to generate test signals for application to a plurality of devices-under-test (DUTs) 16 disposed in a handling apparatus 140. A signal interface 150 defines a plurality of direct signal paths to couple the pin electronics to the handling apparatus, thereby maximizing the density of a plurality of signal paths, minimizing the number of connections for each signal path, and correspondingly improving tester reliablility.

Further referring to FIG. 1, the tester 10, including the system controller 12 and the associated pin electronics 20, is housed in a self-supporting frame (not shown) defining an integrated test cell. The integrated test cell frame minimizes clean-room floorspace with a relatively small footprint. A more detailed description of the frame is set forth in copending U.S. patent application Ser. No. 09/410,857, entitled "Integrated Test Cell", filed Oct. 1, 1999, assigned to the assignee of the present invention, and hereby expressly incorporated herein by reference.

The system controller 12 preferably comprises a Windows NT platform-based computer including, for example, a Pentium class processor running at several hundred MHz. Peripherals such as a 4 GB hard drive memory, 64 MB of RAM memory, and a SVGA controller/monitor round out the computer. For flash memory testing, local processors 56 (FIG. 2) are disposed in the pin electronics 20 as more fully explained below to provide asynchronous test control capabilities between DUTs 16. This substantially improves tester throughput because of the unique and somewhat unpredictable electrical characteristics of flash memory devices.

Figure 2:
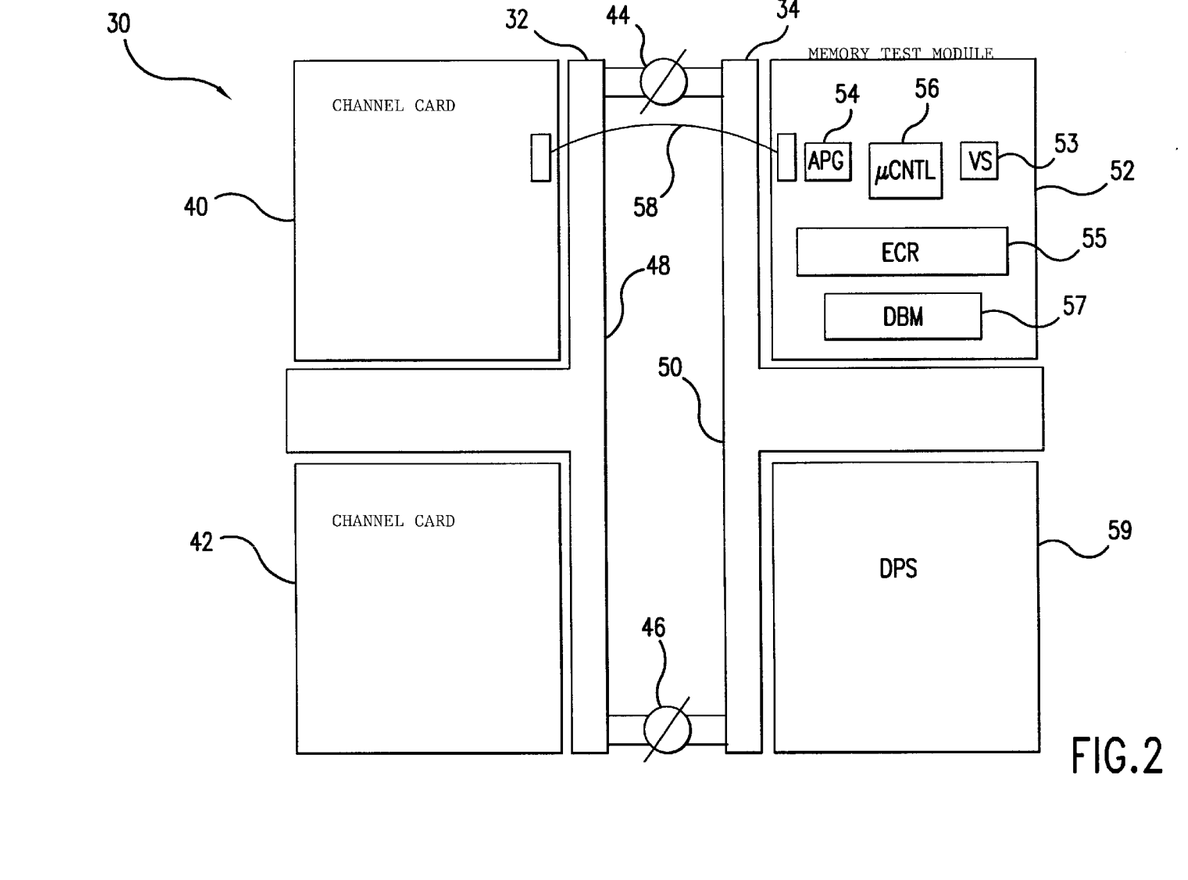
FIG. 2 is a top plan view of an unfolded board frame assembly shown in FIG. 1.
Figure 3:
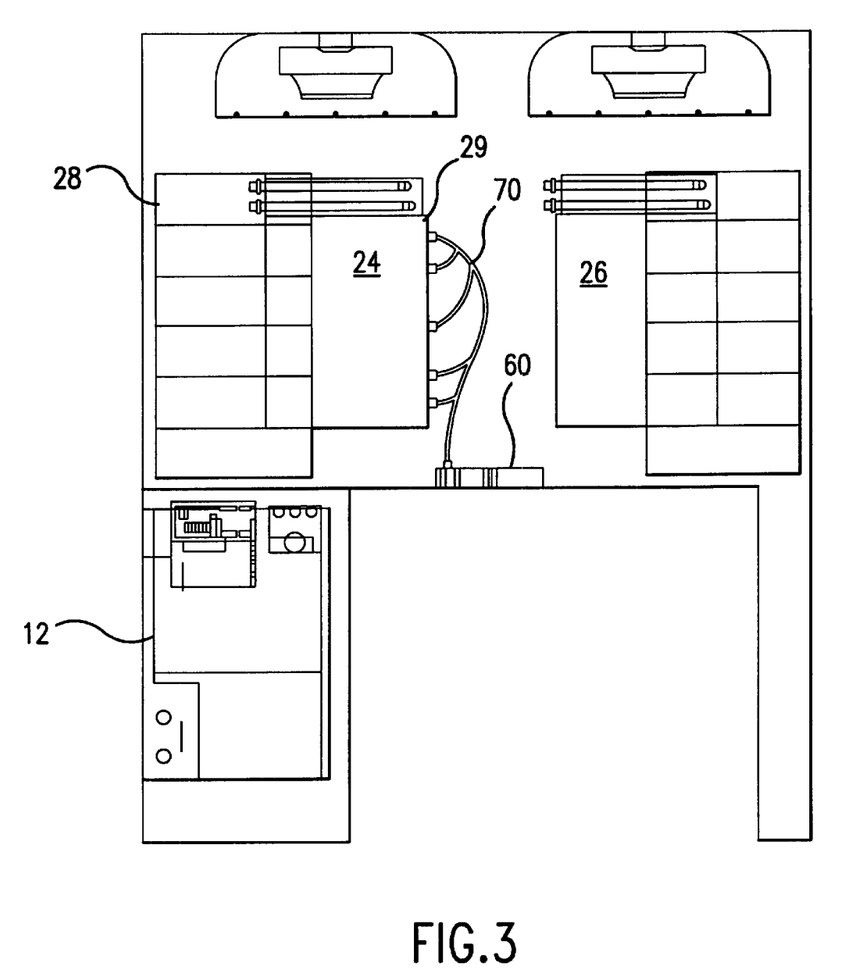
FIG. 3 is a partial frontal view of the tester of FIG. 1.

Referring now to FIGS. 1, 2 and 3, the pin electronics 20 (FIG. 1) comprises a plurality of modularized board assemblies 30 mounted in a pair of oppositely disposed card cages 24 and 26 (FIG. 3). In addition to mounting sixteen of the board assemblies, each card cage preferably includes five DC power modules 28 (FIG. 3), a power controller module (not shown), a calibration board (not shown), and one backplane assembly 29. The backplane assembly differs somewhat from a conventional backplane assembly in that relatively short signal traces (not shown) are employed to minimize any undesirable impedance problems.

Because of the sophisticated circuitry necessary to test each DUT, and in particular flash memory devices, the inventors have discovered that integrating and linking smaller circuit boards together to form the pin electronics rather than fabricate large integral circuit boards offers significant manufacturing advantages for the tester vendor. The advantages involve the improved board yields from circuit board production that result from smaller assemblies, where defects involving solder joints and the like can potentially scrap an entire board. By separating each board assembly into smaller units, a scrappable defect only eliminates a relatively small board from production, rather than a larger and more expensive integral board.

Further referring to FIG. 2, each channel board assembly 30 includes a rigid metallic board frame split into respective members 32 and 34. The frame members are formed respectively with T-shaped borders that sandwich the edges of the respective channel cards 40 and 42. A pair of hinges 44 and 46 defining a hinge assembly join the rear edges 48 and 50 of both frame members to form a spine. The hinge assembly allows the frame members, when plugged into the backplane assembly 29, to fold in a substantially 180 degree open relationship. Fully assembled, the preferred board frame assembly dimensions are approximately 20×20 inches.

For flash memory testing applications, the two channel cards 40 and 42 in the channel board assembly 30 preferably comprise respective copies of a thirty-two channel channel card (for a total of sixty-four channels). Each channel card is formed similar to those employed in the Teradyne Model J750 Integra tester, manufactured by Teradyne, Inc., Boston, Mass. A precision force/measuring instrument (PMU) (not shown) mounts to the channel cards.

Disposed opposite the channel cards 40 and 42 in each board assembly 30 is a third board 52. The third board preferably comprises a memory test module assembly configured with an arithmetic pattern generator (APG) 54 and a station controller or local processor 56 for asynchronous control of a particular DUT with respect to the other simultaneously tested DUTs 16. Additionally, respective voltage source (VS) 53, error catch ram (ECR) 55, data buffer memory (DBM) 57 and DUT power supply (DPS) 59 modules are mounted on the board assembly 30. The channel cards 40 and 42 and the memory test module 52 are interconnected with a series of flexible ribbon cables 58, and additionally coupled to the backplane assembly 29 (FIG. 1). In accordance with the modularity aspect of the present invention, each board frame assembly substantially includes sufficient tester resources necessary to test one DUT 16. Consequently, to test thirty-two DUTs in parallel, a total of thirty-two board frame assemblies are implemented in the two card cages 24 and 26.

The calibration board (not shown) plugs into the backplane assembly 29 for each card cage 24 adjacent the channel board assemblies 30 and includes a system crystal clock (not shown), and a loadboard ID communications device (not shown). A plurality of timing calibration master driver/compare circuits (not shown) are also provided.

Figure 5:
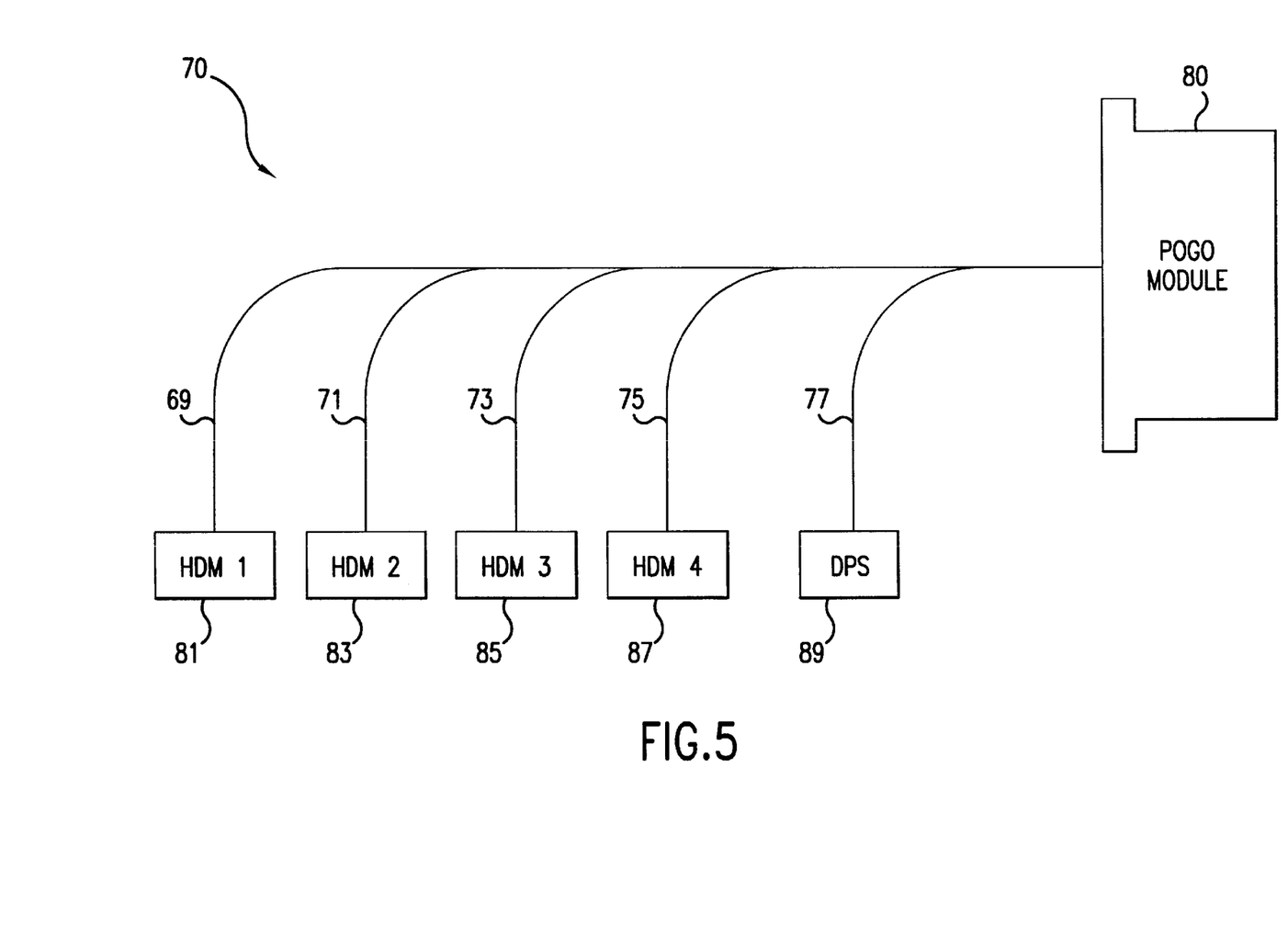
FIG. 5 is a block diagram of the harness assembly shown in FIG. 1.

Referring now to FIGS. 1, 3 and 5, the ability to minimize the backplane assembly trace paths arises from the implementation of a plurality of modular harness assemblies 70 that route the signal paths from the pin electronics 20 to a probe ring 60. This also provides a compact mechanism for distributing tester signals in an organized manner. The probe ring and the harness assemblies collectively comprise the signal interface 150 (FIG. 1).

Figure 4:
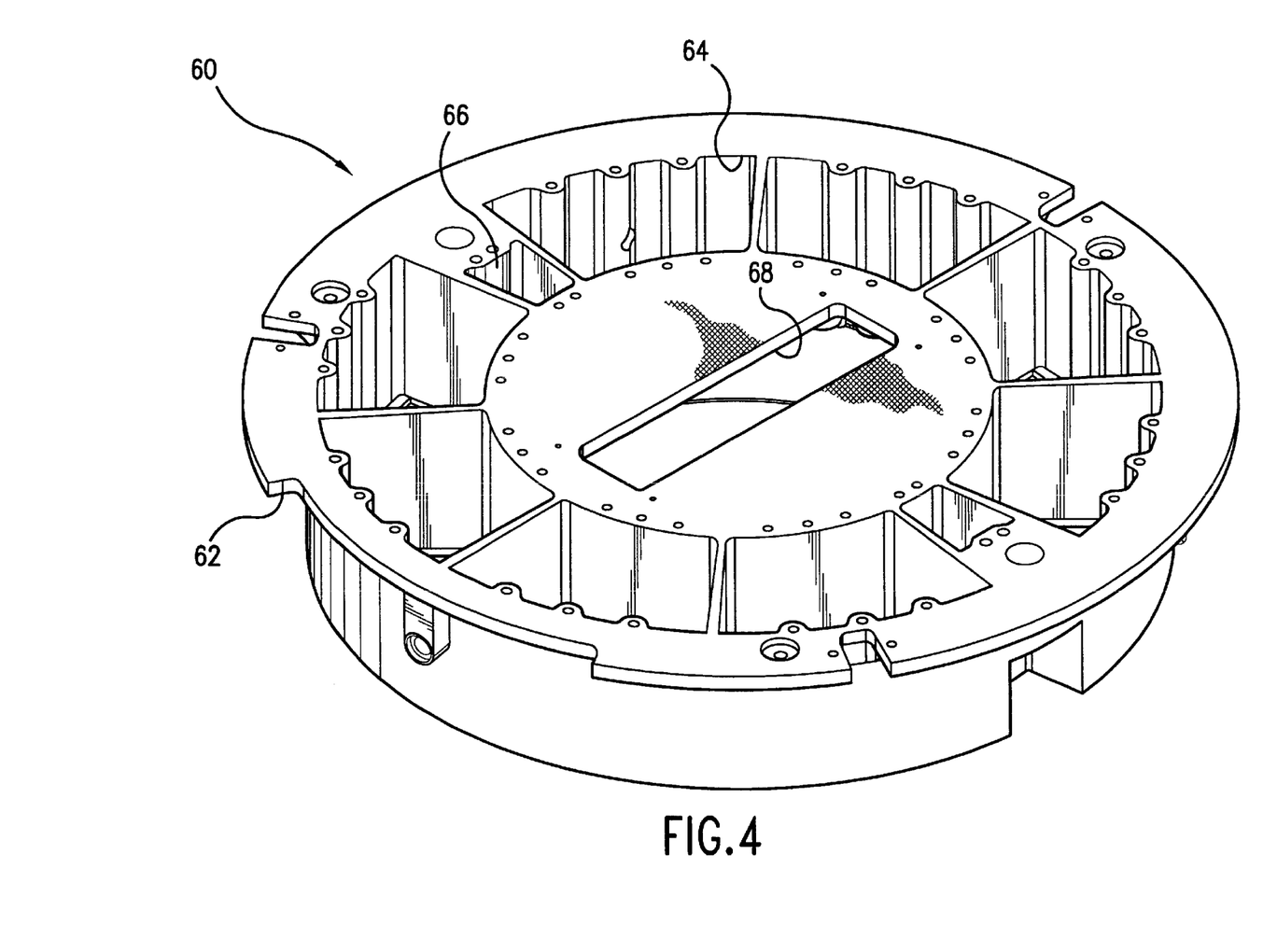
FIG. 4 is a perspective view of the probe ring shown in FIG. 2.
Figure 6:
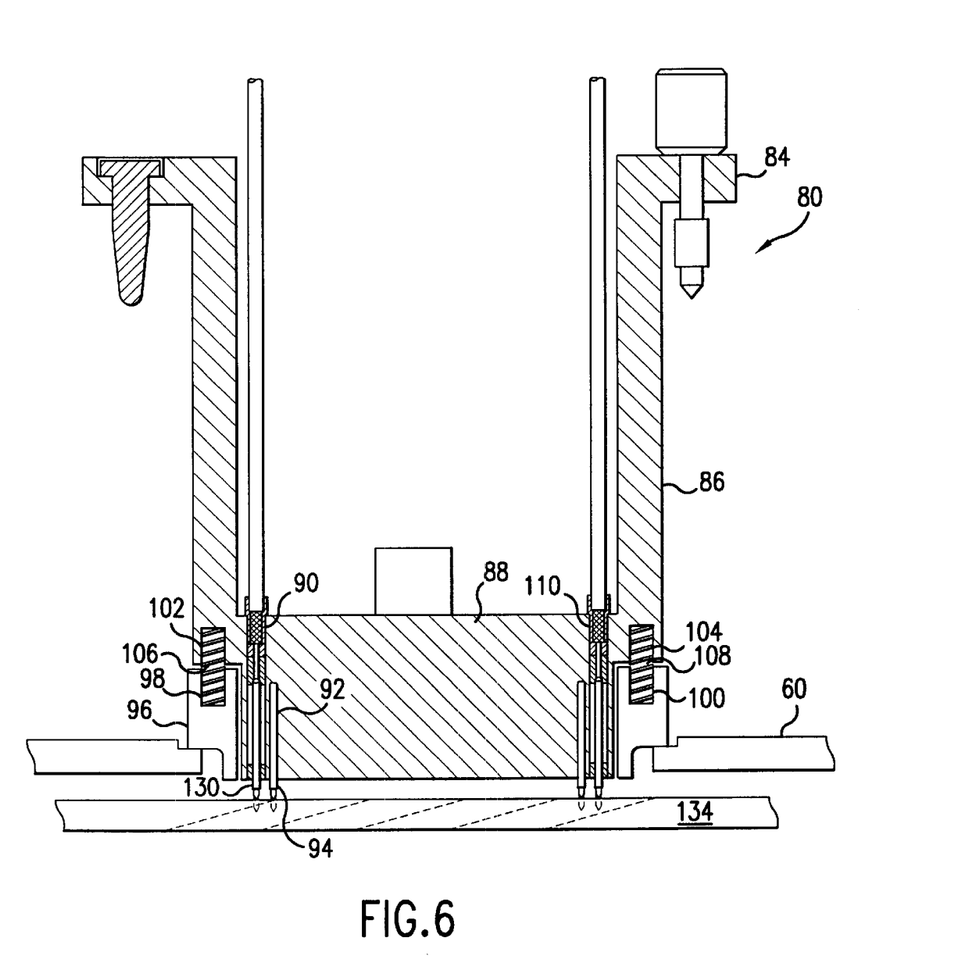
FIG. 6 is an enlarged radial cross-sectional view of the pogo module shown in FIG. 1.

With particular reference to FIG. 4, the probe ring 60 comprises a substantially circular-shaped aluminum casting including a radially projecting peripheral flange 62. A plurality of open-ended cavities 64 are formed in an annular configuration in the ring for nesting respective pogo modules 80 (FIG. 6). Two additional reduced-in-size cavities 66 are formed on opposite sides of the probe ring for receiving respective calibration modules (not shown). Preferably, the casting is formed approximately fourteen inches in diameter and three inches thick, with a total of ten formed cavities. A centrally disposed rectangular opening 68 is formed in the ring to provide clearance for a pivot connection to a self-alignment mechanism (not shown). A more detailed description of the self-alignment mechanism is found in previously referenced copending U.S. patent application Ser. No. 09/410,857, entitled "Integrated Test Cell."

Referring now to FIGS. 2, 5 and 6, the harness assemblies 70 conveniently couple the pin electronics 20 (FIG. 1) to the probe ring 60 (FIG. 4) in a manner that offers quick troubleshooting and effective field repair to specific signal paths or channels. With particular reference to FIG. 5, each harness assembly includes a cable bundle 65 of signal and power supply cables that collectively terminate proximally at a pogo module 80. The bundle includes a plurality of branches 69, 71, 73, 75 and 77 that include respective HDM connectors 81, 83, 85, 87, and 89 for coupling to respective first through fourth board frame assemblies 72, 74, 76, 78 (FIG. 1) and a DUT power supply board (not shown). Each harness conveniently supports the testing of four DUTs, and is easily serviceable and replaceable.

With particular reference now to FIG. 6, the pogo module 80 comprises an aluminum housing formed with an upper mounting flange 84 that projects outwardly from a polygonal wall 86. The wall is formed integral with and surrounds a cylindrical engagement interface 88 having a high-density array of closely-spaced throughbores 90. The throughbores are configured to receive approximately ninety signal pogo pin assemblies 110 having respective signal pogo pins 130. Interposed between the throughbores is a high-density array of downwardly opening blind bores 92 for receiving ground pogo pins 94. Each signal pogo pin is substantially surrounded by a group of the ground pogo pins to maintain a substantially ideal fifty ohm transmission line environment for optimal signal quality.

Disposed concentrically around the engagement surface 88 of the pogo module 80 is a polygonal pogo pin protector 96 formed with a plurality of seats 98. The seats are constructed to align opposite similarly formed bores 102 disposed in the polygonal wall 86, and cooperate therewith to house respective springs 106. A self-aligning snap retainer (not shown) secures the pogo pin protector to the pogo module 80.

The calibration modules (not shown) are formed substantially similar to the pogo modules 80 but in reduced dimensions commensurate with the reduced number of connections required between the calibration boards (not shown) and the probe ring 60.

Figure 7:
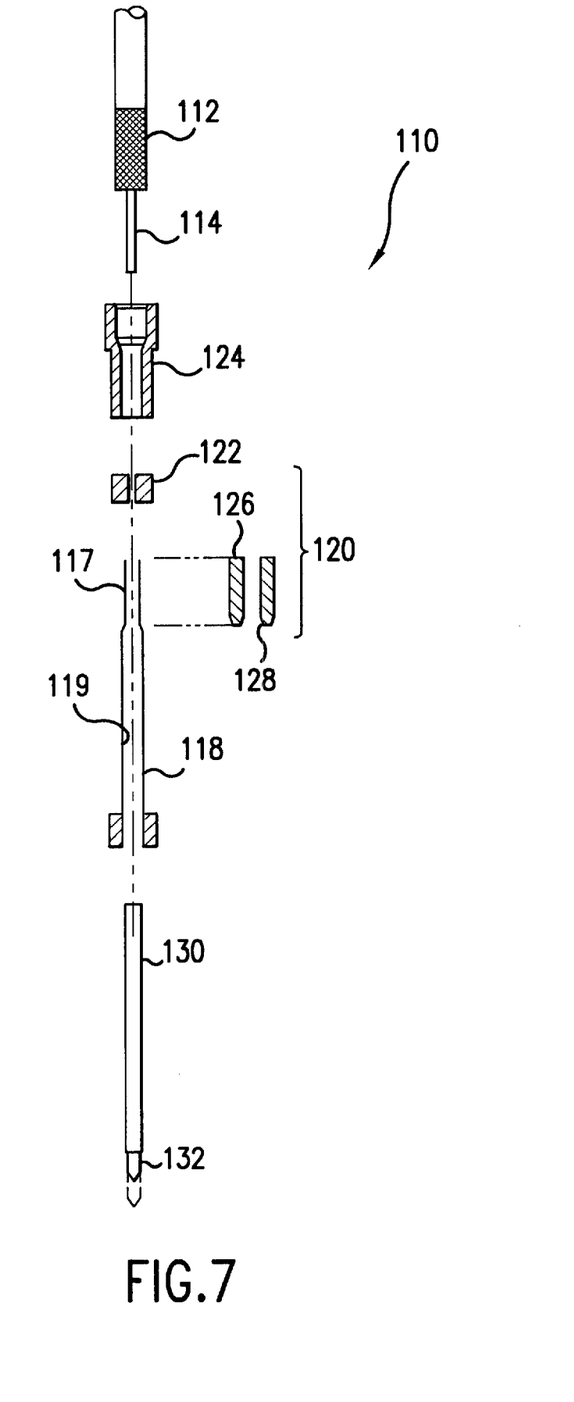
FIG. 7 is an enlarged and exploded axial cross-sectional view of the pogo pin assembly shown in FIG. 6.

Referring now to FIG. 7, each signal pogo pin assembly 110 includes a high fidelity RG-type coaxial cable including a shield conductor 112 and a center conductor 114. Each cable is approximately 37 inches long for bundling in a harness assembly 70 as previously described above. The center conductor of each cable terminates in the crimped portion 117 of a metallic pogo receptacle 118 available from Rika Denshi of Tokyo, Japan. The crimped termination between the center conductor and the pogo pin creates a gas-tight cavity 119.

One of the more significant features of the present invention involves the use of an insulator assembly 120 that substantially surrounds the center conductor 114 and the crimped portion 117 to compensate for any impedance mismatching caused by pogo component junctions, terminations and the like. Compensating for any adverse effects to the fifth ohm transmission line impedance is especially important to ensure the optimal signal quality for each signal path through the densely packed probe ring.

The insulator assembly 120 includes a first cylindrical insulator 122 formed to entirely surround a portion of the center conductor 114 and abut a ground ferrule 124. the ground ferrule is soldered to the shield and snugly fits within a throughbore 90 to establish a ground path between the shield and the pogo module 80. A second insulator 126 is disposed adjacent the first insulator, and is formed with a C-shaped configuration and a distal taper 128 to complementally engage the crimped portion 117 of the pogo receptacle 118. A signal pogo pin 130, available also from Rika Denshi, nests within the pogo receptacle and includes a retractable tip 132 for contacting a probe card contact (not shown).

The arrays of signal and ground pogo pins 130 and 94 disposed in each of the pogo modules 80 engage a probe card 134 (FIG. 6) on a handling apparatus 140, which for purposes of wafer-level testing, preferably comprises a prober (FIGS. 1 and 2). The probe card ranges from between 300 to 350 mm in diameter to support 2048 signal channels and includes contacts (not shown) that couple to the pins of from one to thirty-two DUTs, providing a relatively high level of parallelism to maximize tester throughput. A preferred prober is the TEL Model P8XL prober, manufactured by Tokyo Electron Ltd. of Tokyo, Japan.

Alternatively, the handling apparatus 140 comprises a handler (not shown), such as the Galileo Model handler, available from Kinetrix, Inc. of Bedford, N.H. As is well known in the art, handlers provide the capability of testing packaged-devices mounted on loadboards (not shown) that interface with the probe ring.

Prior to operation, the semiconductor manufacturer installs a semiconductor wafer (not shown) formed with up to several hundred devices into the prober 140, and secures the probecard 134 thereover. The probecard generally includes an engagement mechanism that contacts the individual "pins" of each device to enable subsequent coupling to the probe ring 60 via the signal and ground pogo pins 130 and 94. One of the unique features of the preferred prober involves a quick change mechanism (not shown) that provides for swapping of wafers or probe cards without the need for undocking the prober 140 from the tester 10. The prober and tester collectively define a test system 200.

In operation, the tester 10 system controller 12 provides a convenient operator interface for a user to monitor the progress and results of the parallel tests. For flash memory testing, each DUT 16 is subjected to a plurality of tests that verify the functional operation of the device according to manufacturing specifications. To provide clarity in the operation of the test system, the following description addresses the signal routing during test for a single DUT.

The test generally involves the generation of pattern signals by each APG 54 according to software carried out by each local processor 56. The signals are distributed by the channel cards 40 and 42 and define individual channels or signal paths corresponding to separate pins of the DUT. Signals propagating along channels associated with a single device are routed from the channel cards to the backplane assembly 29, and thereupon transferred through a corresponding HDM connector to the separate coax cables that comprise a branch portion of one harness assembly 70. As the signals reach the high density pogo module 80 and propagate along the center conductor/pogo pin connection, a slight degradation to the fifty-ohm transmission line impedance occurs at the proximal tip of the ground ferrule 90. The degradation is immediately compensated by an inverse effect generated by the insulator assembly 120. Moreover, the crimped portion 117 of the pogo receptacle causes an additional impedance mismatch that is conveniently compensated for by the effects of the C-shaped second insulator 126.

The propagating signals then conduct along the respective signal pogo pins, with a relatively high quality pulse-shape made possible by the surrounding ground pogo pins 94 around each signal path. The signals are then routed along the probe card 134, and translated along fine electrical probes (not shown) that engage the semiconductor wafer (not shown), and the particular DUT 16 of interest. Depending on the type of test employed, the signals may be written to specific addresses within the DUT, and subsequently read back for comparison to expected values.

Those skilled in the art will appreciate the many benefits and advantages afforded by the present invention. For example, implementation of the tester of the present invention in a production environment is particularly beneficial because of the direct signal connections from the backplane assembly 29 to the signal interface 150. The inventors have discovered that this substantially increases the "mean-time-between-failures" (MTBF) for the tester, correspondingly contributing to lower overall costs.

On occasion, however, a discrepant channel or signal path may need repair or replacement. In this respect, the modular construction of the present invention provides a quick troubleshooting capability to locate entire signal paths, reducing the time required in isolating a potential problem. Even more importantly, the modularity of the invention allows an efficient and straightforward replacement of a channel board assembly 30, or a harness assembly 70, or even a pogo pin assembly 110 with minimal effort and stand down time. This dramatically minimizes the "mean-time-for-repair (MTFR) parameter for the tester which also substantially contributes to overall lower semiconductor production costs.

Moreover, the signal interface of the present invention provides a way of carrying out fairly large-scale parallel testing on conventionally sized wafers or loadboards without sacrificing signal integrity through the probe ring. This is accomplished through the implementation of the unique pogo pin assembly that provides impedance compensation for any transmission line degradations.

While the invention has been particularly shown and described with reference to the preferred embodiments thereof, it will be understood by those skilled in the art that various changes in form and detail may be made therein without departing from the spirit and scope of the invention.

For example, while the modular description set forth herein indicates a dedicated board assembly and pogo module per DUT tested, it should be understood that the present invention may also be utilized to test multiple copies of DUTs having relatively small pin counts. In that same regard, DUTs having relatively high pin counts (greater than sixty-four channels for example), may be tested by combining more than one sixty-four channel board.

Additionally, although the parallelism aspect of the present invention has been described with reference primarily to wafer-level probe testing, the invention is applicable also to packaged-level devices manipulated by a handler, and interfaced through a loadboard rather than a probecard. Both loadboards and probecards are often generically characterized by the term device-interface-board. Consequently, for purposes of the invention, the term handling apparatus is used broadly to denote either the use of a handler or a prober.

What is claimed is:

1. A semiconductor tester for testing a plurality of DUTs secured to a handling apparatus, said tester includes:
   a system controller for initiating system test signals;
   a pin electronics assembly responsive to said system test signals for generating test pattern signals for application to said plurality of DUTs; and
   a signal interface adapted for defining a plurality of direct signal paths, when said tester is coupled to said handling apparatus, between said handling apparatus and said pin electronics assembly, the signal interface including,
      a substantially circular probe ring formed with a plurality of axially opening cavities, said cavities disposed in a spaced-apart annular configuration; and
      a plurality of modular harness assemblies, each of said plurality of modular harness assemblies including respective proximal and distal ends, said proximal end including a pogo module for nesting in one of said plurality of axially opening cavities and said distal end including at least one connector for engaging said pin electronics assembly.

2. A semiconductor tester according to claim 1 wherein said probe ring is formed of a casting and includes a radially projecting peripheral flange, said probe ring further including a centrally formed and open-ended slot for receiving a pivot arm.

3. A semiconductor tester according to claim 1 wherein:
said pogo module is formed with an array of closely spaced throughbores, each of said throughbores configured to receive a pogo pin assembly.

4. A semiconductor tester according to claim 1 wherein:
said pogo module comprises an aluminum housing.

5. A semiconductor tester according to claim 1 wherein:
said pogo module includes a retractable spring-loaded pogo pin protector.

6. A semiconductor tester according to claim 1 wherein:
each of said plurality of modular harness assemblies includes a cable bundle strain relief.

7. A semiconductor tester for testing a plurality of DUTs secured to a handling apparatus, said tester includes:
a system controller for initiating system test signals;
a pin electronics assembly responsive to said system test signals for generating test pattern signals for application to said plurality of DUTs; and
a signal interface adapted for defining a plurality of direct signal paths, when said tester is coupled to said handling apparatus, between said handling apparatus and said pin electronics assembly, the signal interface including,
a substantially circular probe ring formed with a plurality of axially opening cavities, said cavities disposed in a spaced-apart annular configuration; and
a plurality of modular harness assemblies, each of said plurality of modular harness assemblies including respective proximal and distal ends, said proximal end including a pogo module for nesting in one of said plurality of axially opening cavities, the pogo module formed with an array of closely spaced throughbores, each of said throughbores configured to receive a pogo pin assembly, the pogo pin assembly including
a coaxial cable having a center conductor and a shield, said shield terminating at a distal end, and said center conductor projecting axially from said distal end and defining a distal tip;
a pogo pin fixed in close-spaced axial relationship to said distal tip via a pogo receptacle; and
an impedance compensation element coupled to said cable and pogo pin, and said distal end including at least one connector for engaging said pin electronics assembly.

8. A semiconductor tester according to claim 1 wherein:
said pin electronics assembly includes a hinged board frame mounting a plurality of circuit boards, and a backplane assembly, said backplane assembly interposed between said hinged board frame and said signal interface.

9. A semiconductor tester for testing a plurality of DUTs secured to a handling apparatus, the handling apparatus having a device-interface-board coupled to the plurality of DUTs, the tester including:
means for initiating system test signals;
means, responsive to the system test signals, for generating test pattern signals for application to the plurality of DUTs; and
means for interfacing the test pattern signals between the handling apparatus and the means for generating test pattern signals.

10. A semiconductor tester according to claim 9 wherein the means for interfacing includes:
a substantially circular probe ring formed with a plurality of axially opening cavities, the cavities disposed in a spaced-apart annular configuration; and
a plurality of modular harness assemblies, each of the plurality of modular harness assemblies including respective proximal and distal ends, the proximal end including a contact module for nesting in one of the plurality of axially opening cavities and the distal end including at least one connector for engaging the pin electronics assembly.

* * * * *